United States Patent [19]

Mastrangelo

[11] 4,359,414
[45] Nov. 16, 1982

[54] INSULATIVE COMPOSITION FOR FORMING POLYMERIC ELECTRIC CURRENT REGULATING JUNCTIONS

[75] Inventor: Sebastian V. R. Mastrangelo, Hockessin, Del.

[73] Assignee: E. I. Du Pont de Nemours and Company, Wilmington, Del.

[21] Appl. No.: 201,785

[22] Filed: Oct. 29, 1980

Related U.S. Application Data

[60] Continuation-in-part of Ser. No. 938,801, Sep. 1, 1978, abandoned, which is a division of Ser. No. 825,179, Aug. 17, 1977, abandoned, which is a continuation-in-part of Ser. No. 532,298, Dec. 12, 1974, abandoned, which is a continuation-in-part of Ser. No. 317,377, Dec. 22, 1972, abandoned.

[51] Int. Cl.$^3$ .................. H01B 3/18; H01B 1/06; B32B 5/16
[52] U.S. Cl. .................. 523/200; 252/511; 252/512; 252/518; 365/103; 338/18; 338/20; 338/21; 338/223; 428/926; 428/929; 428/931; 428/328; 428/332; 523/220; 524/441
[58] Field of Search .................. 252/63.5, 62.2, 62.3, 252/511, 512; 338/18, 20, 21, 223; 357/1, 2, 4, 6, 10; 317/232, 233

[56] References Cited

U.S. PATENT DOCUMENTS 2,273,704  2/1942  Grisdale .................. 252/518 X
2,857,560  10/1958  Schnable .................. 317/235
3,407,495  10/1968  Montgomery .................. 29/610
3,588,638  6/1971  Fleming et al. .................. 317/238
3,685,028  8/1972  Wakabayashi et al. .................. 340/173 R

OTHER PUBLICATIONS

Schmidt, Testing of Polymers, vol. I, (1966), pp. 290, 291-293, 238-241.

Primary Examiner—John D. Welsh

[57] ABSTRACT

An electric current regulating junction that can be electrically activated to a low resistance state in which it is capable of passing a relatively low reading current. The junction is capable of being activated electrically so as to be switched between low resistance and relatively high resistance states and vice versa. To switch from the low resistance to the high resistance state, one may apply relatively low currents (at least 10 times the magnitude of the reading current) in the form of a current-limited pulse, the pulse being regulated so that it will decay rapidly at the end. The junction comprises a normally insulative, electrically activatable composition having an electrical resistance greater than $10^8$ ohms through a layer 0.1–2,540 microns thick. The composition consists essentially of 10 to 90 volume percent of a substantially linear, unitary polymeric binder, and 10 to 90 volume percent of particles substantially homogeneously dispersed in the binder having an electrically conductive metallic interior and a thin insulative surface coating sufficient to impart contact resistance. The unitary polymer has a glass transition temperature of at least 100° C. and may be an aromatic polyimide, poly(amide-imide), poly(ester-imide) or polyamide.

16 Claims, 2 Drawing Figures

INSULATIVE COMPOSITION FOR FORMING POLYMERIC ELECTRIC CURRENT REGULATING JUNCTIONS

CROSS REFERENCE TO RELATED APPLICATIONS

This is a continuation-in-part of application Ser. No. 938,801 filed Sept. 1, 1978 as a divisional of application Ser. No. 825,179 filed Aug. 17, 1977 as a continuation-in-part of application Ser. No. 532,298 filed Dec. 12, 1974 as a continuation-in-part of application Ser. No. 317,377 filed Dec. 22, 1972, all abandoned.

BACKGROUND OF THE INVENTION (1) Field of the Invention

This invention relates to electric current regulating junctions that can serve as electrically actuated switches.

(2) Description of the Prior Art

New developments in the semiconductor memory industry include activatable contacts by means of which semiconductor devices arranged in a regular array can be serially connected with conductors according to a predetermined pattern so that some devices in the array are active and others are not. Such a system is called a read-only memory (ROM) system since it is useful for screening computer input or output. The process of selectively connecting only those semiconductor devices in the array that are intended to be active is referred to as writing into the read-only memory. Generally, there is prepared a complete regular array of semiconductor devices, even though some will not be used in establishing the desired pattern, with a junction between each semiconductor device and at least one of its connecting conductors. Certain junctions are activated to make semiconductor devices active in the desired pattern. As the connective link between the conductor and the semiconductor device, the junction must be highly conductive to avoid build-up of excessive heat which is produced by electrical power dissipation in the junction and which can limit the packaging densities of semiconductor devices per unit volume.

In summary of the above, elements for densely packaged read-only memory arrays must contain junctions that can display low electrical resistance, either when first formed in contact with a semiconductor device or when activated to make a semiconductor device controllably active. Junction compositions must be thermally stable at temperatures commonly used to form ohmic alloy contacts of metal conductors to semiconductor devices in the same and neighboring elements in a read-only memory array when the junction is formed before the contacts are made.

For alterable read-only memory (AROM) use, the junction must be able to function as a switch to make a semiconductor device controllably active or inactive. For example, it must be able to change from low resistance to high resistance to deactivate the semiconductor device in order to correct errors made in writing into the memory or to make substantial changes in the pattern of the memory.

Switchlike devices which are made with mixtures of electrically conducting and insulating materials of the art may not be suitable for use as junction compositions because they do not afford sufficient range of electric current regulation, they present too much electrical resistance, they tend to revert spontaneously at ordinary temperatures in memory use from a low resistance state to a high resistance state, or they are not thermally stable enough to withstand processing conditions commonly used in microcircuit and integrated circuit technology. For example, such devices may not be able to withstand heating to temperatures at which alloy bonding of contacting conductors to semiconductor devices commonly takes place or they may in their conductive states show excessively high resistances.

Junction compositions which are prepared by the vapor phase deposition of pure metal directly onto a semiconductor substrate, such as silicon, may not be sufficient to establish satisfactorily low contact resistance values because of the potential interference of just a few monolayers of silicon dioxide which may be present on portions of the semiconductor substrate in a memory array. The metals which generally are employed for vaporization are those that can be heated after vapor deposition to form a metal alloy with a silicon substrate at reasonable temperatures, such as 350°–450° C., to insure long-lived ohmic contacts of acceptably low conductivity. Aluminum is an example of such a vaporizable metal.

A need exists for compositions that do not require extensive processing in preparing electric current regulating junctions.

SUMMARY OF THE INVENTION

It is an object of this invention to provide an insulative junction composition that can be electrically activated to a low resistance state. It is another object to provide a low resistance current regulating junction that allows high packaging density of elements in a memory system. It is another object to provide an activated junction that does not revert spontaneously at ordinary temperatures to a high resistance state. It is an additional object to provide an alterable read-only memory junction composition that can be switched between low and relatively high resistance states by simple electrical means to correct errors or make changes in a pattern of active semiconductor devices. It is a further object to provide a junction composition that is stable at temperatures commonly used to form contacts between conductors and semiconductor devices in read-only memory systems.

In summary, the invention is directed to insulative compositions that can be activated to low resistance states by one or more methods of electrical treatment, such as described below, said compositions consisting essentially of 10 to 90 volume percent of particles having an electrically conductive metallic interior and a thin insulative surface coating sufficient to impart contact resistance, said particles being substantially homogeneously dispersed in 90 to 10 volume percent of a substantially linear, unitary polymeric binder having a glass transition temperature ($T_g$) of at least 100° C., preferably at least 150° C. As the term is used herein, $T_g$ is measured according to the method described in "Newer Methods of Polymer Characterization," editied by Bacon Ke, Interscience Publishers, New York, N.Y., 1964, page 393 et seq. By unitary polymer is meant an organic polymer which does not depend on the presence of additional reactants to achieve its ultimate stiff (high $T_g$) character (for example, it does not require crosslinking agents such as the polyamines used to cure epoxy resins). By "consisting essentially of" is meant those ingredients of the composition which are essential to the invention. It is not intended to exclude from the composition other materials which are non-essential to the invention so long as the advantageous features achieved by the invention composition are not substantially adversely affected. The invention is also directed to the electrically resistive compositions, useful as current regulators, which are produced by electrical activation of the dielectric compositions. This invention is also directed to the electric current regulating junction which is produced by the electrical discharge activation of the dielectric composition of this invention.

One specific embodiment comprises said composition in the form of a current regulating junction activated electrically to a low resistance state, said junction in the low resistance state being capable of passing a relatively low reading current, said junction being capable of being activated electrically so as to be switched between low resistance and high resistance states, such junction having utility in memory arrays as more fully described below. In such a junction, the normally insulative electrically activatable composition has an electrical resistance greater than $10^8$ ohms through a layer 0.2 to 2,540 microns thick. Preferably, for this utility, the junction-forming composition comprises from 75 to 15 volume % of said binder and from 25 to 85 volume % of said particles, to attain a low resistance upon activation, as exemplified hereinafter.

In a preferred embodiment, the binder and the metal component are chosen so as to provide a junction that is thermally stable at temperatures used to form low resistance contacts between conductors and semiconductor devices, for example, temperatures in the range 200°–450° C. A preferred method of electrical activation is application across the junction of a D.C. (direct current) pulse of short duration, usually between a microsecond and millisecond. Also generally applicable for electrical activation is brief application of an A.C. (alternating current) potential.

Switching from the low resistance to the high resistance state can be effected by application of relatively low currents, which, however, should be substantially greater than, e.g., at least 10 times the magnitude of the reading current. The switch-off current can be a steady current, but preferably, for memory use, will be in the form of a current-limited pulse, the pulse being regulated so that at the end of the pulse the current drops very rapidly to a new low value, usually zero. In particular, the current pulse will be rapidly decaying such as produced in the discharge of a charged capacitor. Preferably, for alterable read-only memory use, the rapidly decaying current pulse will have a duration of up to 100 milliseconds, preferably not more than 10 milliseconds, and will provide an effective quantity of switch-off energy (i.e., the energy required to switch from the low to the high resistance state) of up to 0.1 joule (watt second), preferably not more than 0.01 joule.

When the junction is in the high resistance state, it can be switched to the low resistance state by application of a voltage pulse, typically between about 10 volts and 300 volts, the pulse being regulated so that at the end of the pulse the current drops comparatively slowly to a low value.

DETAILED DESCRIPTION OF THE INVENTION

Figure 1:
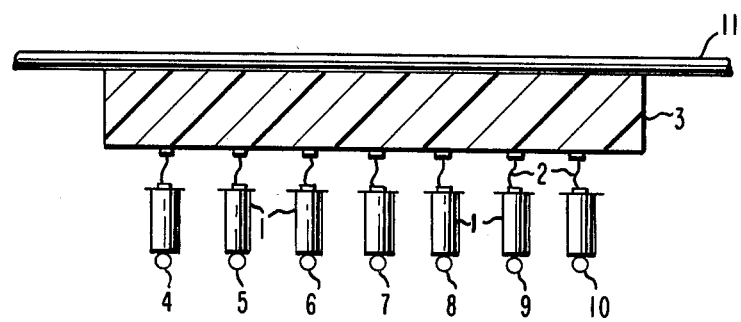
FIG. 1 is a side elevational view partially in section of one bank of an array of semiconductor devices, each in spring loaded contact with a continuous film of an electric current-regulating composition.

The invention herein resides in the above-described insulative composition and the useful electric current regulating junctions that are produced therefrom. The substantially linear, unitary polymeric binder in said composition has a glass transition temperature ($T_g$) of at least 100° C., preferably at least 150° C.; it should be unreactive with said filler particles; and it should be capable of withstanding the thermal stress which may be applied during the manufacture of the system of which it is a part, for example, during the formation of low resistance ohmic contacts between conductors and semiconductor devices.

In one method of ohmic contact formation, heat is used to form an alloy of a metal, generally deposited by vacuum evaporation, and the particular semiconductor material used. Typical in the art are alloy bonds between aluminum metal and a silicon semiconductor or between gold metal and a germanium semiconductor. Since the composition of this invention may be present on at least a portion of the semiconductor surface during the heating step employed to effect alloying of the conductor component to the semiconductor surface, and since the alloying temperatures are normally in the range 200°–450° C., the filled binder must be stable at such temperatures. For example, gold/germanium contacts are heated at 300° C. for about 5–30 minutes during their production; the more common aluminum/silicon contacts require similar times at 450° C. during their production.

The filled binder's ability to withstand degradation and loss of operativeness during the high temperature junction contact-forming step can be determined by a simple test which involves heating the composition at the selected alloying temperature for 2 hours and determining the weight loss. Compositions of this invention showing a weight loss of not more than 3%, preferably not more than 1%, are useful as junction-forming compositions. When solvent casting is to be employed to deposit a junction composition in a contact-forming procedure, the solvet should be removed by heating the composition to 100° C., under reduced pressure if necessary, to achieve constant weight, before heating to the alloying temperatures employed in the test.

The stiff, substantially linear, unitary polymers which are useful herein include substantially linear thermoplastic polymers and polymers, such as the aromatic polyimides, which although theoretically linear, appear to have some degree of crosslinking between the polymer chains (as evidenced by their high degree of insolubility) due to intermolecular reactions between polymer functional groups. Despite the possibility of crosslinking between polymer chains, the use of such polymers provides for "one pot" formulations for producing the electrically activatable junctions and heaters of this invention since there is no dependence on the presence of additional cross-linking components. Thus, the polymeric binders useful herein provided for rapid and simple preparation of the junctions and heaters.

Included among the polymeric binders which are useful in the junction-forming compositions of this invention are polymers which contain small amounts of solvents or other materials which may slightly reduce their glass transition temperatures by acting as plasticizers. Normally, such additives have little effect upon the thermal stability of the polymers since they are usually low boiling and easily volatilized. In microcircuit preparation, such additives should be removed from the polymers by volatilization before vacuum deposition of the metal conductors to avoid out-gassing problems and contamination of pump oil.

The utility of the composition of this invention is considerably dependent upon the glass transition temperature ($T_g$) of the polymer used. It has been found that for stability of the low resistance state of the junction at room temperature a polymer having a $T_g$ of at least about 60° C. is required (Example 5, Table IV). However, since memory junctions may be subject to considerably higher temperatures in use, for the purposes of this invention polymers with a $T_g$ of at least 100° C. are employed and those with a $T_g \geq 150°$ C. (that is, equal to or greater than 150° C.) are preferred. Use of such high $T_g$ polymers minimizes the tendency for such memory junctions to pass spontaneously from the low resistance state to the high resistance state (Example 7).

Representative polymeric binders that have $T_g$ values of at least 100° C. include organic polymers, typical examples of which can be selected from the well known aromatic polyimides, aromatic poly(amide-imides), aromatic poly(ester-imides), and aromatic polyamides. Representative members of these classes and their $T_g$ values are listed in Table I.

TABLE I

| Organic Polymers | $T_g$ (°C.) |
|---|---|
| Aromatic polyimide (DAPE—PMDA) | 380 |
| Aromatic poly(amide-imide) (MAB/PPD—PMDA) | 265 |
| Aromatic polyamide (70% IP/30% TP—MPD) | 130 |

DAPE = diaminodiphenyl ether
PMDA = pyromellitic dianhydride
MAB = m-aminobenzoic acid
PPD = p-phenylenediamine
IP = isophthaloyl chloride
TP = terephthaloyl chloride
MPD = m-phenylenediamine Aromatic polyimides having a $T_g$ of at least 100° C., preferably at least 150° C., represent a preferred class of polymers which are useful herein as binders. Such polyimides and their preparation are well known in the prior art, for example, as shown by U.S. Pat. Nos. 3,179,630; 3,179,631; 3,179,632; 3,179,633; 3,179,634; and 3,287,311, the contents of which are incorporated herein by reference. Useful polyimides can be represented by the formula

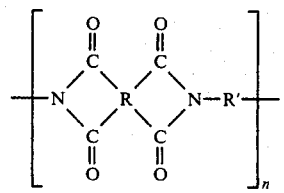

n is an integer sufficiently large to provide the requisite mechanical properties for binder use, R is a tetravalent radical derived from an aromatic tetracarboxylic acid dianhydride, the aromatic moiety having at least one ring of six carbon atoms and characterized by benzenoid unsaturation, and R' is a divalent radical derived from a diamine. Aromatic tetracarboxylic acid dianhydrides which are useful for preparing operable polyimides include those wherein the four carbonyl groups of the dianhydride are each attached to separate carbon atoms in a benzene ring and wherein the carbon atoms of each pair of carbonyl groups are directly attached to adjacent carbon atoms in a benzene ring. Examples of dianhydrides suitable for forming polyimide binders include pyromellitic dianhydride; 2,3,6,7-naphthalenetetracarboxylic dianhydride; 3,3',4,4'-diphenyltetracarboxylic dianhydride; 1,2,5,6-naphthalenetetracarboxylic dianhydride; 2,2',3,3'-diphenyltetracarboxylic dianhyride; 2,2-bis(3,4-dicarboxyphenyl)propane dianhydride; bis(3,4-dicarboxyphenyl)sulfone dianhydride; and 3,3',4,4'-benzophenonetetracarboxylic dianhydride.

Organic diamines which are useful in the preparation of operable polyimides include those which are represented by the formula $H_2N—R'—NH_2$ wherein the divalent radical R' is selected from aromatic, aliphatic, cycloaliphatic, combinations of aromatic and aliphatic, heterocyclic, and bridged organic radicals wherein the bridge atom is carbon, oxygen, nitrogen, sulfur, silicon or phosphorus. R' can be unsubstituted or substituted, as is known in the art. Preferred R' radicals include those which contain at least six carbon atoms and are characterized by benzenoid unsaturation, for example, p-phenylene, m-phenylene, biphenylylene, naphthylene and

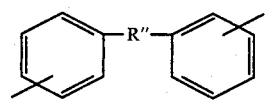

wherein R'' is selected from alkylene or alkylidene having 1-3 carbon atoms, O, S and $SO_2$.

The diamines described above also can be used in the formation of the polyamide binders. Among the diamines preferred in the formation of polyamide and polyimide binders are m-phenylenediamine; p-phenylenediamine; 2,2-bis(4-aminophenyl)propane; 4,4'-diaminodiphenylmethane; benzidine; 4,4'-diaminodiphenyl sulfide; 4,4'-diaminodiphenyl sulfone; 3,3'-diaminodiphenyl sulfone; and 4,4'-diaminodiphenyl ether.

As disclosed in the prior art, some polyimides are not easily fabricatable because of their high melting points. With such polyimides, the metal particles which are required in the composition of the present invention are introduced during the preparation of the polyimide. For example, they can be added to the polyamic acid, a fabricatable intermediate in the formation of the polyimide. As is well known, the polyamic acid can be dissolved in a suitable carrier solvent. Employing such techniques, the metal particles can be dispersed in a polyamic acid in a carrier solvent, the amounts of polyamic acid and metal particles intimately mixed by such dispersion being such that upon conversion of at least part of the polyamic acid to polyimide and removal of at least part of the carrier solvent, there will be produced the previously described polyimide-metal particle composition. Such well-mixed polyamic acid-carrier solvent-metal particle compositions can be shaped as desired prior to the conversion of polyamic acid to polyimide and removal of carrier solvent.

A particularly preferred polyimide binder having a $T_g$ of about 380° C. can be prepared from the precursor polyamic acid in N-methyl-2-pyrrolidone, available commercially as "PYRE-ML" Wire Enamel RC-5057. The polyimide produced from such a polyamic acid and having aluminum particles dispersed in it can withstand a temperature of 450° C. for sufficient time to form (by alloying) ohmic low resistance contacts of aluminum conductors to silicon semiconductor devices in the same or neighboring elements of an alterable read-only memory array, and it can withstand continuous use at 220° C.

Aromatic polyamides having the requisite $T_g$ are disclosed in U.S. Pat. Nos. 3,006,899; 3,094,511; 3,232,910; 3,240,760; and 3,354,127, the contents of which are incorporated herein by reference. One such polymer which is useful herein can be represented by the formula $-COC_6H_4CONHC_6H_4NH-_n$ wherein n is a large integer. Particularly preferred is a polymer of such formula wherein the $-COC_6H_4CO-$ units are isophthaloyl and/or terephthaloyl units and the $-NHC_6H_4NH-$ units are m-phenylenediamine units. One such particularly preferred aromatic polyamide binder can be obtained by reaction of essentially equimolecular quantities of m-phenylenediamine and phthaloyl chloride, the phthaloyl chloride being a mixture of about 70 mole % isophthaloyl chloride and 30 mole % terephthaloyl chloride. Such a polymer having a $T_g$ of 130° C. is sufficiently thermally stable at 300° C. to allow formation of a gold/germanium alloy and it is useful, usually as a solution containing metal powder dispersed therein, for forming electric current regulating junctions for germanium devices.

The particles which are used in the composition of this invention are insulatively coated so as to block the passage of electric current from one metal particle to another through the polymer binder. Even though the particles have an electrically conductive metallic interior ($10^6$ to $10^3$ reciprocal ohm-cm.), a thin insulative surface coating is sufficient to impart contact resistance when the particles are touching in the binder. Consequently, the mere dispersing of particles in the polymer binder fails to provide a low resistance conductive path. The surface that makes the particles insulative can be formed by coating the surface of a metallic particulate material with an insulative chemical compound of the metal being coated, such as an oxide, sulfide or nitride of the metal. Readily obtained metals carrying an oxide coating that renders the aggregate of particles in the binder electrically insulative are aluminum, antimony, bismuth, cadmium, chromium, cobalt, indium, lead, magnesium, manganese, molybdenum, niobium, tantalum, titanium and tungsten. A preferred metal is aluminum with a tarnish film of insulative aluminum oxide which is readily formed by exposure to ambient atmospheric conditions.

When the junction is to be employed in contact with a semiconductor device, the metal for the metallic particles of the junction composition of this invention should be chosen so as to be compatible with the underlying semiconductor surface. The metal chosen can be a nondopant for the semiconductor host, for example, silicon, of the contacting surface region of the semiconductor device. It can also be a dopant for said semiconductor host provided the type of conductivity it would normally impart is the same as the given type of the contacting surface region of the semiconductor device. In other words, the metal is chosen so that it would not dope said semiconductor host in the opposite sense to that in which it was already doped in the formation of the semiconductor device. For example, it is well known that aluminum is a P-dopant and antimony is an N-dopant for silicon. Hence, a junction containing aluminum is compatible with a silicon surface doped in the P sense and a junction containing antimony is compatible with a silicon surface doped in an N sense.

A mixture of metals can also be used provided the mixture is compatible with the semiconductor device, as discussed above. Such a mixture may be in the form of particles of an alloy and/or in the form of mixed pure metal particles.

The size of the particles can range from about 0.01 to 250 microns. Preferred is the size range from about 0.05 to 20 microns. In general, the average particle size is no greater than 0.1 the junction layer thickness.

The particles are present in the composition of the junction layer of this invention in an amount which is sufficient to permit electrical activation. Generally, the amount of particles is 10-90% by volume, usually at least 25% by volume, and preferably 25-85% by volume, to attain low resistance upon activation. The balance to achieve 100% is substantially the polymeric binder. The amount of particles should not be so large that the physical strength of the binder is seriously deteriorated or the surface of the junction is excessively rough.

The normally insulative but electrically activatable composition of this invention is a form-retaining solid because of the stiffness of the binder material employed. The composition and the junction can be formed in any of many known ways for homogeneously dispersing particles in a polymeric binder and for forming a junction layer of desired thickness and shape. For example, a coating or a semiconductor surface can be conveniently obtained by applying a solution of the binder in a suitable volatile solvent, with the particles being dispersed therein. The dispersion can be applied to the semiconductor device by painting, spraying, dipping or other conventional techniques involving evaporative drying to form the binder-dispersed particle junction. As already indicated above, when a high melting polyimide is employed as the binder, it may be more conveniently handled as its polyamic acid precursor dissolved in a suitable solvent. Such a polyamic acid solution can be employed in the aforesaid junction-forming procedure. The polyamic acid solvent should strongly associate with both the polyamic acid and the polyimide polymer that is subsequently produced and it should be removable by volatilization. Suitable solvents include N,N-dimethylformamide, N,N-dimethylacetamide, dimethyl sulfoxide, N-methyl-2-pyrrolidone and tetramethyl urea. After being coated on a substrate, such as a semiconductor, the polyamic acid can be readily converted to a polyimide in situ by heating to effect ring closure with elimination of water; before conversion to the polyimide, the carrier solvent is volatilized off.

If the polymeric binder is readily meltable, a junction can be made by casting or extruding onto the semiconductor substrate a polymer melt containing dispersed metal particles. Alternatively, a film of the composition can be cast on a support, stripped therefrom, and pressed against the semiconductor contact to make the junction.

The current regulating junction usually is a layer whose shape and dimensions depend on the particular use. When in contact with N-type or P-type conductive regions of a semiconductor device, layer thickness may be 1–100 mils, preferably up to 75 mils (25.4–2,540 microns, preferably up to 1905 microns) in microassembly elements or 0.1–25.4 microns in microcircuit elements. Its width is usually at least twice its thickness; its length along the semiconductor surface may be considerably greater. Electrical resistance through the layer in the unactivated state is typically greater than $10^8$ ohms. The electrical resistance of the insulative composition of this invention in the unactivated state, for example, in a layered form useful as a current regulating junction, results from the dielectric nature of the polymeric binder and from the insulative coating on the particles dispersed in the binder. It can be overcome, however, by subjecting the composition to an electric potential which exceeds a threshold value in that it is sufficient to cause electrical activation. It can be postulated that during such electrical activation, high voltage electrical discharges break down the insulative coatings on the particles which are in the path provided by the electrical discharges passing through the junction to the semiconductor device. The first discharge appears to form at least one conductive path through the junction layer. As a result, electrical activation is marked by a sudden initial transition to a state of low resistance.

A preferred method of electrical activation is application of a D.C. (direct current) pulse of short duration, usually between a microsecond and a millisecond, across the element. The polarity of the pulse is unimportant. When the thickness of the junction is less than 25 microns, a potential of 5 to 15 volts is usually sufficient; for greater thicknesses, potentials up to several hundred volts may be required. Preferably, the current is limited to about 100 milliamperes, although limitation to lower currents may be required if sensitive components lie in the current path.

Also generally applicable for electrical activation is the brief application of an A.C. (alternating current) potential. In this case, the application should not be significantly more brief than ½ cycle. In other respects, the procedure is as described above for D.C. activation.

When the junction is in the low resistance state, it can be switched to the high resistance state by application of relatively low currents as described above, preferably current-limited pulses, and in particular, rapidly decaying current pulses. By a current-limited pulse is meant a brief flow of current which is kept below a predetermined magnitude by a means such as a resistor in series with the switching device. A convenient means is a regulated voltage source coupled with a limiting series resistor, which together comprise a current supply capable of about 50 milliamperes output. In use, the current which passes through the junction is observed to decrease steadily to about zero, suggesting that the metallic conductive material in the conductive paths is subject to switching. In this embodiment, the current will normally be limited to a pulse of about 0.1 to 10 milliamperes, the pulse being regulated so that at the end of the pulse the current drops very rapidly to a new low value, usually zero. For the pulse, the lower portion of the stated range is preferred, although occasionally currents as high as 50 milliamperes may be required.

The transition from the low to the high resistance state can be effected more suddenly (fast decay) by application of a rapidly decaying current pulse, for example by discharging a capacitor so as to provide 25–50 milliamperes peak current or pulse for about one millisecond. In this embodiment, the magnitude of the current does not appear to be critical and may vary widely, e.g., from milliamperes or less to 10 amperes or more, provided the current is delivered in the form of a rapidly decaying pulse whose duration is limited and is regulated so that at the end of the pulse the current drops very rapidly to a new low value, usually zero, and the energy delivered to the switch by such pulse is of a low order of magnitude. The current pulse will normally have a duration of up to 100 milliseconds, preferably not more than 10 milliseconds, and will provide an effective quantity of switch-off energy of up to 0.1 joule, preferably not more than 0.01 joule.

About the same switching-off current conditions are sufficient for relatively thick junctions in microassemblies as for thin junctions in microcircuits. Suitable switching-off conditions are readily determined by trial using selected rapidly decaying current pulse means. For a junction of a given composition and geometry, there will be a minimum voltage required for switch-off with a given capacitor. The maximum voltage will be governed by the upper limit on the switch-off energy, which for capacitor use is a function of the capacitance and the voltage as given below. Correspondingly, for a given voltage, there will be required a capacitor of a certain minimum size for effective switch-off, the upper limit on the capacitor being determined by the upper limit on the energy input as defined.

The energy supplied by capacitor discharge is given by the equation:

$$Q = \tfrac{1}{2} CE^2$$

wherein C is the capacitance in farads, E the applied voltage in volts, and Q the energy in watt-seconds or joules.

The time constant of the capacitor discharge is the time required for the applied voltage to decay to 1/e or 37% of its value on discharge and which is calculable from the capacitance and the resistance, i.e.

$$\text{Time Constant (microseconds)} = \mu F \text{ (microfarads)} \times R \text{ (ohms)}$$

For the purposes of the invention, the time constant is taken as the time of duration of the current pulse. Also, for purposes of calculation, when the capacitor is discharged directly through the switch, the resistance of the junction in the low resistance state (normally on the order of ohms) is taken as R in the above equation. Under such conditions, the current initially flowing may be on the order of amperes, and the time constant on the order of microseconds.

When a resistor is employed in series with the capacitor to moderate the current flowing to the switch, the resistance for calculating the time constant will be the sum of resistance of the switch and of the resistor. The energy supplied to the switch will be decreased in ratio to the resistances, i.e., $$Q = \tfrac{1}{2} CE^2 R(\text{switch})/R(\text{switch}) + R(\text{resistor})$$

Under such conditions, the time constant can be controlled in the millisecond range, e.g., 0.1–10 milliseconds, with energies on the order of $10^{-6}$ or $10^{-7}$ joules.

Rapidly decaying current pulses may also be supplied via transistors, in which case the energy is given by the equation:

$$EIt = Q$$

in which E is in volts, I in amperes, and t in seconds (the duration of the pulse) and Q in joules.

It should be noted that rapidly decaying current pulses can also be used to turn the switch on, i.e., switch from the high resistance state to the low resistance state. In such case, a combination of voltage and capacitance will be chosen to provide a sufficient amount of energy for switch-on. The amount of energy required for switch-on depends on whether the switch is initially in the original unactivated high resistance state or in the operating high resistance state, the so-called off-state. Switching from the original unactivated high resistance state to the low resistance state, i.e., the on-state, requires a higher voltage and greater energy input than subsequent switchings off and on. Once the switch has been activated, by whatever method, switching on again by the capacitor discharge method requires a lesser amount of energy than that required for switch-off, all readily determined by trial.

An alternate method of electrical activation or switching from the high resistance state involves use of an A.C. discharge. Frequently useful for this purpose is the device commonly known as a Tesla coil or vacuum tester (commercially available); however, with such a device it is difficult to precisely localize the activation. Normally, a very brief application of the vacuum tester discharge is sufficient, the electrode of the vacuum tester being kept out of contact with the junction.

The Tesla coil is a special form of transformer used to obtain very high secondary voltages from small direct current voltages. The transformer primary circuit leads through an automatic break that is opened and closed at a high frequency of about 500–2,000 cycles per second. Discharges of unequal strength occur in the secondary circuit upon the opening and closing of the circuit breaker. The junction of this invention is placed in the secondary circuit. Low junction resistance is preferably obtained by (1) including an air gap in the secondary circuit, for example, by bringing the terminal point of the Tesla coil to a distance of about one quarter to one half inch away from the junction to favor the break discharge and make the discharge current smaller and more undirectional, (2) moving the Tesla coil terminal point from side-to-side to direct the discharges over the surface area of the junction to create many breakdown paths, and (3) insulating the junction and the contacting semiconductor device from electrical ground by placing the element either by itself or as a part of an array on a supporting surface that is an electrical insulator, thus reducing the voltage drop and current flow in the junction. Normally, Tesla coil discharges for about 1–5 seconds are sufficient to reach the point of diminishing return in effecting transition of the dielectric composition of this invention to a state of low resistance. Once that state is reached, the resistance value remains essentially unchanged during the application of a small reading current.

The electrical resistance of the junction in the low resistance state, as measured with the Simpson ohmmeter, Model 269, ranges from less than one ohm to about 1,000 ohms, usually being in the range of 5 to 50 ohms. Said resistance is lowered by use of large size metal particles, activation with a high voltage (in any manner), or making the current path through the junction short. Higher low resistance state values of resistance occur if the volume proportion of metal is below 25%.

The resistance in the high resistance state (for a junction which has never been treated with a Tesla coil) is typically greater than $10^8$ ohms. Once a junction has been treated with a Tesla coil, the resistance of any subsequently attained high resistance state is from $10^3$ to $10^7$ ohms.

The ratio between high resistance and low resistance states for any given junction generally is at least $10^2$, sufficient for wide utility. Digital solid state circuitry usually functions well with one order of magnitude change, although a greater change may be desirable to allow a margin of safety. Switching between high and low resistance states can be carried out for at least 10, and frequently, for more than 100 cycles. Both high and low resistance states are stable for periods of months and are unaffected by application of small reading currents, which will normally be no more than one-tenth that of the switch-off current.

Elements comprising a combination of an electric current regulating junction of this invention and a compatible semiconductor device are generally useful in alterable, high packaging density, memory systems made up of a plurality of such elements in an array with affixed contacting conductors and suitable writing and reading means. The convenience of changing the pattern of active semiconductors in an array by simple electrical means makes repair or conversion of a memory system in the field very simple. During the manufacture of arrayed elements the preferred polyimide-based current regulating junction can withstand the elevated temperatures commonly used to form ohmic low resistance contacts between metal conductors and semiconductor devices, for example, 450° C., the temperature which is used in alloy bonding of aluminum to silicon. Also, regarding element manufacture, the formation of a junction by polymer coating techniques may be simpler than by vacuum deposition techniques.

In the following examples all parts are by weight unless otherwise noted.

EXAMPLE 1

A, To prepare a junction for a microassembly, the following procedure was used. Two parts of a commercially available, atomized, spherical aluminum powder (having an average particle size of about 20 microns) were dispersed with stirring in a solution of one part of a solid polyamide in N,N-dimethylacetamide (a 15% by weight solution). The polyamide was a high molecular weight condensation polymer of equimolecular portions of m-phenylenediamine and a mixture of 70 parts of isophthaloyl chloride and 30 parts of tetephthaloyl chloride. The polyamide had a $T_g$ of 130° C. and a specific gravity of 1.32. The mixture was then poured onto a "Teflon" TFE (polytetrafluoroethylene) film-coated plate which had been preheated to 50 C.; it was then heated to 150 C. to evaporate off the solvent and form a film. The film was pressed with a "Teflon" coated iron which was heated to 150 C. The object of the pressing was to produce a smoother top surface; the pressing caused very little reduction of thickness. Final thickness was about 0.6 mm.

B. As illustrated in FIG. 1, a mechanical jig was fabricated bearing a 7×7 array of silicon diodes 1 (commercially available), each with an Everett and Charles springloaded contact 2. The aforesaid film 3 was inserted into the jig so that the spring-loaded contacts 2 pressed against it. Conductors 4 through 10 were arranged in rows contacting the free diode terminals.

Conductors 11 (shown) through 17 (not shown) were arranged in columns contacting the free side of the film opposite the film surface in contact with the spring-loaded contacts. The jig illustrates a system for a read-only memory that contains electric current regulating junctions and semiconductor devices in series, each combination comprising an element of the memory. With proper alignment of the spring-loaded contacts, each element of the array can be separately activated to a low resistance value by a 250 volt electrical discharge of a 0.002 microfarad capacitor and can be switched thereafter between low and relatively high resistance values by previously described means.

EXAMPLE 2

A. Two parts of black, surface oxidized aluminum powder having a particle size of about 0.01–0.03 micron were dispersed with mortar and pestle in five parts of commercially available 16.5% solution of a polyamic acid (15.2% converted polymer solids) in N-methyl-2-pyrrolidone carrier solvent. A junction was formed by casting the solution onto a smooth clean surface of an aluminum foil, heating at 135° C., for 0.5 hour, then at 300° C. for 1 hour to complete the formation of the polyimide binder for the dispersed aluminum particles and to evaporate off the carrier solvent and the water of condensation (formed during conversion of polyamic acid to polyimide). The cured film of the junction was about 0.5 micron thick. The junction had a resistance of at least $10^8$ ohms, measured through the film between its top surface and the aluminum foil.

B. The junctiion film was transformed from a high resistance dielectric state into a low resistance conductive state by treating the element as follows. A conventional Tesla coil capable of providing high frequency, high voltage discharges was positioned over the film at a height of about 0.5 inch and discharges from the coil were directed over the entire surface of the film while the junction was supported on an insulative ceramic stand. The coil as turned off after about 2–3 seconds. The electrical resistance of the film was again measured as described above and found to be 50 ohms.

C. The capability of the above junction to be switched between low and high resistance states and its capability to retain such switchability over a perod of time was demonstrated as follows. The junction was connected through contact conductors to a commercially available regulated power supply adjusted to provide a current of about 25 milliamperes through a current limiting resistor. By oscilloscope observation of a signal proportional to the current flow to the element, a steady decrease of the current to about zero was observed to occur in about 100 milliseconds. The electrical resistance of the element was again measured and found to be 2.5 megohms, a resistance which is sufficiently high to make a semiconductor diode inactive in regular computer operation. The junction was cycled back to its low resistance state by means of the Tesla coil as described above. The cycling was repeated three more times and the element was stored inthe low resistance state. After three months the element was examined and was shown to have retained its low resistance; it was still cyclically switchable by the method described above.

Figure 2:
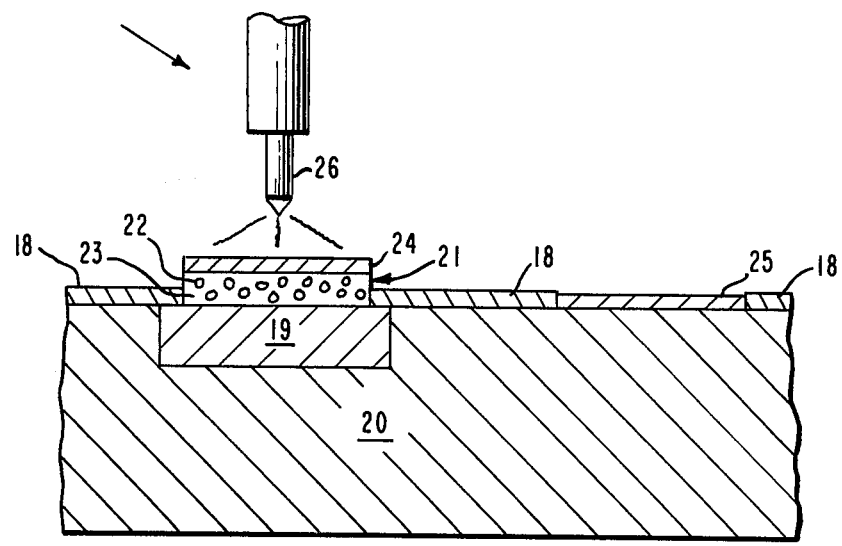
FIG. 2 is a sectional side elevational view showing a junction in bonding contact with a P-type region of a diode, a representative adjacent metal film applied to the neighboring N-type surface, a metal film applied to the opposite side of the junction and Tesla coil excitation means for activating the junction to a state of low resistance.

D. The above data and the known thermal stability of the polyimide binder material suggest that the junction composition of this example may be particularly suitable for forming junctions for semiconductor devices that are to be subject to relatively high temperatures, such as silicon-based semiconductor devices. Semiconductor diodes of monocrystalline silicon can be formed from a melt by conventional growth techniques, using a seed. Subsequent diffusion of a P-type dopant such as boron into the surface will produce a current-rectifying diode. Such a diode is shown in direct contact with a junction formed from a composition of this invention in FIG. 2.

Using known procedures, a layer of $SiO_2$, 18, a little less than 0.5 micron thick, is produced on most of the surface of the diode, leaving apertures over part of the P-type region 19 and part of he N-type region 20, about 5–10 microns distant from the P-type region.

The exposed portion of the P-type region is covered with a layer 21, 2–5 microns thick, of the above-described junction-forming composition. The diode is then heated to 135° C. for ½ hour and 300° C. for 1 hour to drive off solvent and convert the polyamic acid to polyimide. The junction is composed of aluminum particles 22 dispersed in polyimide 23. Then, again by known procedures, aluminum conductive layers 24 and 25 are applied to the junction and the N-type area, respectively. The aluminum conductor 25 on the N-type substrate 20 is next alloyed to the silicon by heating to about 450° C. for 5–30 minutes. Next, the junction-semiconductor element of this invention is activated by exposure to a Tesla coil 26 discharge as described in Part B. The element can be switched between the active low resistance state and the inactive high resistance state by the cycling techniques described in Part C.

EXAMPLE 3

A junctiion composition was prepared by mixing 1.0 g. of a commercially available aluminum powder with 2.5 g. of the polyamic acid solutiion of Example 2 and 3 ml. of dimethylformamide. A microscope slide (1 inch×3 inches) was prepared by transversely applying a series of 5 pairs of rectangular ⅛ inch wide strips of adhesive-backed aluminum foil. Each strip in a pair was arranged so that it almost met the other strip of that pair along the center rof the slide and each strip extended to the edge of the slide. The pairs of strips were numbered 1 to 5 and the gap of separation where each pair of strips failed to meet was designated d (given in mils). Each gap and a portion of each strip of the pair making the gap were then covered with a layer of the junction composition about 2 or 3 mils thick. The prepared slide was then dried at 135° C. for ½ hour, followed by 1 hour at 300° C. The junctions were then activated with a Tesla coil as previously described and the resistance of each was measured to give a value L-1 (all resistance measurements were made with Simpson ohmmeter Model 269 and are given in ohms). Each junction was then switched to a high resistance state by momentary application of 18–20 volts. The resistances were again measured giving values H-1. The junctions were switched back to the low resistance state with the Tesla coil, giving resistances L-2. Continuing this pattern, the junctions were further switched back and forth in the same way, giving resistances H-2, L-3, H-3, L-4, H-4, . . . up to and including L-22, H-22 (as shown in Table II).

TABLE II

| Pair Number | d | L-1 | H-1 | L-2 | H-2 | L-3 | H-3 | L-4 | H-4 | L-5 | H-5 | L-6 | H-6 | L-7 | H-7 | L-8 | H-8 | ** | L-22 | H-22 |
|---|---|---|---|---|---|---|---|---|---|---|---|---|---|---|---|---|---|---|---|---|
| 1 | 20 | 6.0 | 20K | 6.5 | 20K | * | >20K | * | 20K | 12 | * | 30 | >20K | 6 | * | 2 | 30K | ** | 5 | 15K |
| 2 | 20 | 9.5 | 20K | 8.0 | 20K | * | 20K | * | 20K | 12 | * | 11 | 20K | 4 | * | 2 | 30K | ** | 9 | 15K |
| 3 | 20 | 7.0 | 20K | 5.0 | 20K | * | 1.5K | * | 20K | 7.5 | * | 13.5 | 20K | 9 | * | 4 | 20K | ** | 3 | 20K |
| 4 | 25 | 9.0 | 20K | 5.5 | 20K | * | 500 | * | 20K | 8 | * | 10.5 | 20K | 6.5 | * | 3.5 | 5K | ** | 6.5 | 8K |
| 5 | 15 | 5.0 | 20K | 4.0 | 20K | * | 1000 | * | 250K | 12 | * | 8.5 | 20K | 7.5 | * | 8 | 25K | ** | 3.0 | 25K |

*resistance not measured
**cycles L-9, H-9 to L-21, H-21 not shown
> = greater than
K = thousands

EXAMPLE 4

Junction compositions were prepared using the aluminum powder (varying weights) and the polyamic acid solution (10.0 g.) of Example 3. Also as in that example, microscope slides were prepared, but with gaps of approximately ⅛ inch. The gaps were covered with the junction composition to a depth of about 6–10 mils and the slides were baked at 135° C. and 300° C. as in Example 3. Each junction (after reading the resistance, H-1, with a Simpson ohmmeter, Model 269) was then activated by the application of 600 volts through a $10^4$ ohm resistor and the resistance was measured (L-1). Twenty volts was applied momentarily across the resistor and the resistance was measured again (H-2). Then, 50 volts was applied through a $10^4$ ohm resistor and again the resistance was measured (L-2). The last two treatments were repeated (H-3 and L-3). The results are shown in Table III.

TABLE III

| Pair Number | Wt. Al (g.) | Vol. % Al | Resistances (ohms) | | | | | |
|---|---|---|---|---|---|---|---|---|
| | | | H-1 | L-1 | H-2 | L-2 | H-3 | L-3 |
| 1-1 | 0.508 | 15 | Inf.* | 240 | Inf. | 240 | Inf. | 250 |
| 1-2 | " | 15 | Inf. | 150 | Inf. | 1200 | Inf. | 175 |
| 1-3 | " | 15 | Inf. | 200 | Inf. | 270 | Inf. | 280 |
| 1-4 | " | 15 | Inf. | 380 | Inf. | 400 | Inf. | 450 |
| 2-1 | 0.718 | 20 | Inf. | 200 | Inf. | 200 | Inf. | 190 |
| 2-2 | " | 20 | Inf. | 400 | Inf. | 500 | Inf. | 500 |
| 2-3 | " | 20 | Inf. | 200 | Inf. | 210 | Inf. | 210 |
| 2-4 | " | 20 | Inf. | 600 | Inf. | 600 | Inf. | 680 |
| 3-1 | 1.239 | 30 | Inf. | 140 | Inf. | 150 | Inf. | 160 |
| 3-2 | " | 30 | Inf. | 100 | Inf. | 325 | Inf. | 140 |
| 3-3 | " | 30 | Inf. | 90 | Inf. | 100 | Inf. | 90 |
| 3-4 | " | 30 | Inf. | 125 | Inf. | 140 | Inf. | 135 |

*Inf. = infinite

EXAMPLE 5

Compositions were prepared with equal weights of a commerically available aluminum powder and various binders. Each composition was coated onto a microscope slide to form a film about 20 to 50 microns thick (after drying). Films were dried 24 hours at room temperature and then 4 hours at 40°–50° C. Volume percentage of aluminum metal ranged from about 25 to 40% in the dried compositions. Two dots of a commercially available silver paint were applied to the surface of the film approximately 1 cm. apart to serve as electrodes. Each film was then activated by the application of 400 volts D.C. (direct current) through a 10,000 ohm resistor, contact being made by touching the painted dots. Thereafter, resistances between the dots were measured periodically with a Simpson ohmmeter Model 269. The compositions tested and the resistance data for them are set forth in Table IV.

TABLE IV

EFFECT OF $T_g$ ON JUNCTION STABILITY

| Binder | $T_g$ °C. | Resistance (ohms after indicated delay) | | | |
|---|---|---|---|---|---|
| | | None | 2 mos | 4 mos | 6 mos |
| Apiezon Grease | <<−121 | ∞ | ∞ | ∞ | ∞ |
| Apiezon Wax | <<−121 | 150K* | ∞ | ∞ | ∞ |
| Stearic Acid | <−121 | 50K* | ∞ | ∞ | ∞ |
| Beeswax | <−121 | 10K* | ∞ | ∞ | ∞ |
| Paraffin Wax | −121 | 5K* | ∞ | ∞ | ∞ |
| Polyethylene | −121 | 6–10K* | ∞ | ∞ | ∞ |
| Polyether Resin | −67, −85 | 60–200 | ∞ | ∞ | ∞ |
| Du Pont Plastic Cement | — | 200 | ∞ | ∞ | ∞ |
| "Duco" Cement | — | 17K | ∞ | ∞ | ∞ |
| Polyvinylbutyral | 61 | 12 | 12 | 11.9 | — |
| Polyvinyl Chloride | 82 | 4.3 | 4.3 | 4.4 | — |
| Polyacrylonitrile | 87.103 | 9.5 | 9.5 | 9.3 | — |
| Polystyrene ("Styron" 666) | 100 | 3–10 | 3.0 | 3.0 | 3.0 |
| Cellulose Triacetate | 105 | 14 | 14 | 11.3 | — |
| Polymethylmethacrylate | 105 | 5 | 5 | 5 | — |
| Polycarbonate ("Lustran" I) | 130 | 6.0 | 6.0 | 6.1 | — |
| Aromatic Polyamide | ~130 | 10–20 | 10 | 10 | 10 |

*Resistance became infinite after a few seconds
<< = much less than
< = less than
~ = about
K = thousands
∞ = infinite

EXAMPLE 6

The loading of a commercially available aluminum powder in various polyimide binders was studied as a function of resistance after electrical activation. Samples were prepared by dispersion (via hand stirring) of the aluminum powder in solutions of the polymer and coating the surface of a 1 inch×3 inch glass microscope slide therewith at a coating thickness about 4–5 mills thick as follows:

A. 5057 Polyimide

A 15.1% solution of polyamic acid in N-methyl-2-pyrrolidone was used to form the coating which was air-dried at 80° C. overnight, then held for 30 minutes at 135° C. and 60 minutes at 300° C.

B. Polyimide 10301-91

A 22.3% solution of polyamic acid in cresol was used, with air-drying overnight at 80°–90° C. and curing at 250° C. for 30 minutes.

C. "Pyre ML"-111

A 31.3% solution of polyamic acid in acetone was used; the coating was air-dried at 50° C. overnight, then cured at 250° C. for 30 minutes.

After the films were dried and/or cured, a pair of transverse silver strips were painted (using a commercially available silver paint) one inch apart on each slide and dried overnight. The resistance between each pair of silver strips was then measured with a Simpson 269 Series 2 VOM. The slides were activated with a commercially available Tesla coil and the resistances were measured again. The values obtained are in ohms/square since the dried films were about 1 mil thick.

The data are given in Table V, and show that the junction is always non-conductive (initial resistance > $10^{10}$ ohms/square) before electrical activation. The data also show that a non-conductive/conductive threshold exists somewhere between 7 and 10 volume percent aluminum. Finally, an intermediate region seems to exist between 10 and 25 volume percent in which the resistance after activation is dependent on loading, especially between 10 and 15 volume percent. Above that intermediate region, the resistance after activation is independent of loading.

TABLE V

LOADING STUDY OF ALUMINUM IN VARIOUS BINDERS
RESISTANCE (OHMS/SQUARE) BEFORE AND AFTER
TESLA COIL ACTIVATION

| 5057 Polyimide | | | Polyimide 10301-91 | | | Pyre ML-111 | | |
|---|---|---|---|---|---|---|---|---|
| Vol. % Al | Resistance Initial | Final | Vol. % Al | Resistance Initial | Final | Vol. % Al | Resistance Initial | Final |
| 6.5 | >$10^{10}$ | >$10^{10}$ | 4.5 | >$10^{10}$ | >$10^{10}$ | 3.2 | >$10^{10}$ | >$10^{10}$ |
| 9.4 | " | 30K | 6.6 | " | 30K | 4.8 | " | " |
| 12.2 | " | 1K | 8.6 | " | 4K | 6.3 | " | 1.4M |
| 14.7 | " | 60 | 12.2 | " | 1.5K | 9.1 | " | 8K |
| 17.2 | " | 35 | 15.8 | " | 325 | 11.8 | " | 1K |
| 19.5 | " | 22 | 19.0 | " | 45 | 14.3 | " | 300 |
| 21.7 | " | 20 | 31.9 | " | 10 | 25.0 | " | 20 |
| 23.7 | " | 15 | 41.3 | " | 10 | 33.4 | " | 10 |
| 25.7 | " | 15 | 48.4 | " | 10 | 40.0 | " | 10 |
| 34.2 | " | 10 | 65.2 | " | 10 | 51.2 | " | 10 |
| 40.9 | " | 10 | | " | 10 | | | |
| 46.4 | " | 10 | | | | | | |
| 50.9 | " | 5 | | | | | | |
| 54.8 | " | 5 | | | | | | |
| 58.0 | " | 5 | | | | | | |

> = greater than
K = thousands
M = millions
" same as above

EXAMPLE 7

A comparison was made of the stabilities of the low resistance states of two junctions, one made with a polyimide binder having a $T_g$ suitable for this invention and the other made with a commercially available model hobby cement ("Ambroid" Liquid Cement) having a $T_g$ of about 45° C. A commercially available aluminum powder was employed in both junctions. In a manner essentially as described in Example 3, test specimens were prepared as ⅛ inch wide strips with a ¼ inch gap on a 1 inch×3 inch glass microscope slide which had two ⅛ inch wide aluminum foil electrodes pre-glued to it.

The initial resistances were greater than $10^{10}$ ohms. The slides were placed on a hot plate and maintained at a temperature of 125° C. in air overnight. The slides were then removed and activated with a Tesla coil. The resistances were then measured and the slides were returned to the hot plate and maintained at the 125° C. accelerated aging temperature. The resistances were then measured (cold) with the Simpson VOM (on the R×100 scale) from time to time. These results are listed in Table VI.

The results given in Table VI show that whereas the resistance of the "Ambroid" cement junctions approached infinity after 24–36 hours at 125° C., the resistance of the polyimide junctions remained relatively unchanged after 132 hours at 125° C. This confirms that high $T_g$ materials, such as a polyimide, are capable of producing junctions having a longer life in the "on" state at elevated temperatures and are, therefore, superior to low $T_g$ polymeric binders.

All the junctions of this invention disclosed in Examples 3 through 7 are suitable for use in direct contact with a compatible semiconductor device as illustrated in Example 2.

TABLE VI

STABILITY OF JUNCTIONS - POLYIMIDE VS. "AMBROID" CEMENT AT 125° C.

| Sample | Test | \multicolumn{7}{c}{Resistance (Ohms) Versus Time (125° C.)} |
|---|---|---|---|---|---|---|---|---|
| | | 0 hrs. | 12 hrs. | 24 hrs. | 36 hrs. | 60 hrs. | 72 hrs. | 132 hrs. |
| 1. Prepared from 4g. of aluminum in 10 g. of polyamic acid solution | 1 | 160 | 270 | 290 | — | — | 200 | 190 |
| | 2 | 140 | 150 | 160 | 170 | 190 | 180 | 170 |
| | 3 | 230 | 230 | 230 | 230 | 230 | 230 | 230 |
| 2. Prepared from 4g. of aluminum in 10g. of "Ambroid" Cement | 1 | 380 | 420 | 430 | $>10^{10}$ | $>10^{10}$ | $>10^{10}$ | $>10^{10}$ |
| | 2 | 350 | 400 | $>10^{10}$ | " | " | " | " |
| | 3 | 300 | — | 330 | " | " | " | " |

> = greater than

EXAMPLE 8

Readily obtained particles of the metals shown in the following Table VII and carrying oxide coatings (obtained by exposure to ambient atmospheric conditions) were dispersed in an equal volume of the polyamide binder of Example 1. One inch square junction layers of the metal particle-binder composition were formed by casting and drying films to thicknesses of about 0.6 mm. Each film was then transformed from a high resistance state (at least $10^8$ ohms through the layer) to a low resistance state by high frequency, high voltage discharges of a Tesla coil directed over its surface for about 5 seconds. Table VII includes values of resistivity (in ohms/square) that were measured between conductor electrodes affixed to opposite edges of the square-shaped junction layers. Such junctions are suitable for service as electrically actuated switches in combination with semiconductor devices using means previously described herein to effect transitions to relatively high resistance values and to effect transitions back to essentially the same low resistivity values shown in Table VII.

TABLE VII

| Metal | Junction Resistivity (ohms/square) Polyamide Binder |
|---|---|
| antimony | 37.2 |
| bismuth | 31.2 |
| cadmium | 13.2 |
| chromium | 4.0 |
| cobalt | 2.2 |
| indium | 2.0 |
| lead | 99.2 |
| magnesium | 1.0 |
| molybdenum | 1.2 |
| niobium | 10.2 |
| tantalum | 9.2 |
| titanium | 38 |
| tungsten | 2.7 |

EXAMPLE 9

This example demonstrates the switch-off capability of the current-regulating junctions of the invention under rapid decay current pulse conditions. It also compares the effectiveness in this regard of the invention junctions (switches), wherein the binders are substantially linear, unitary polymers, and of junctions of the type disclosed by Leon F. Montgomery in U.S. Pat. No. 3,407,495, wherein the binders are crosslinked polymeric resins.

EXPERIMENTAL DETAILS

A. Preparation of Slides (1) Montgomery-type Switches of U.S. Pat. No. 3,407,495

Montgomery-type switches were prepared according to the description given in the patent.

A mixture of 80 parts of Shell "Epon" 820 epoxy resin and 20 parts of Shell curing catalyst Z was prepared according to the technique provided in a brochure available from the Shell Chemical Co. Forty parts of the mixture were mixed with 42 parts of an aluminum powder which passed through a 500 mesh screen (U.S. Sieve Series), the aluminum powder having been obtained by sieving a commercially available aluminum powder. The mixture was thoroughly mixed (with a wooden spatula) and placed in a vacuum desiccator which was evacuated to $1\mu$ pressure and held there for 30 minutes. Four switch slides were prepared by gluing narrow strips of copper foil, spaced about ½ inch apart, on a 1 inch×3 inch microscope slide and providing a ¼ inch gap at the center. A drop of the switch composition was then used to bridge each gap so that 3 or 4 switches were provided on each slide. The slides, after undergoing the following curing steps, as described in column 2, lines 32–39 of the patent, are referred to hereinafter as Montgomery-type switches: 50° C. for 1 hour; 60° C. for 1 hour; 80° C. for 2 hours; the temperature was then raised from 80° C. to 150° C. in a 2-hour time period, held at this temperature for 24 hours and then gradually cooled to room temperature.

(2) Current Regulating Junction (Switch) of the Invention

An experiment analogous to Example 1 was carried out. To 26.6 milliliters of a 15 w/v% solution of a solid polyamide in N,N-dimethylacetamide (thus containing 4 grams of solid aromatic polyamide) were added 4.22 grams of the sieved aluminum powder (described under A(1)) and switch slides were prepared in the same manner as described above for the preparation of the Montgomery-type switches. Curing of the switches was effected by simply heating the slides (containing the solvent, polyamide and aluminum) for 16 hours at 90° C. on a hot plate.

(3) Current Regulating Junction (Switch) of the Invention

An experiment analogous to Example 2 was carried out. To 26.7 grams of the polyamic acid solution (containing about 15% converted polymer solids) comparable to that used in said Example 2 were added 4.21 grams of the aluminum powder (passing through a 500 mesh screen). Again, switch slides were prepared as described above. Curing was carried out by placing the slides on a hot plate at 90° C. over night (about 16 hours); the slides were then held in an oven for 30 minutes at 135° C. and for 60 minutes at 300° C.

B. Initial Breakdown

To produce an initial breakdown (activation) a circuit was assembled so as to include a voltage source for applying an electric potential across a series arrangement of the switch sample and a decade resistance box. For initial breakdown, a 0-400 volt, 0-250 milliampere (Ma) Heath power supply, in most cases, was used with a 0-1 megohm (MEG) decade resistance box. In some cases, a Lambda DC supply at 800 volts DC (about 10 Ma) was used for the initial breakdown when 400 volts were insufficient. Experiments were carried out to determine the minimum breakdown voltage. One side of the switch sample was grounded through the decade box which was set at 100,000 (100K) ohms and the other side of the switch sample was tapped with the hot side of the power supply, first at 100 volts, then 200 volts, 300 volts, etc. When the Lambda DC supply was used, the decade box was set at 1 megohm. Thus, the voltage was increased until a current was observed to flow on the 0-250 Ma millammeter (from 0-400 volts) or a spark was observed (from 400-800 volts). The resistance of the switch sample was then measured (reported in TABLE VIII) with a Simpson resistance meter (100K ohms/volt). The breakdown voltage was then used to uniformly break down other switch samples used in the study. In the case of the Montgomery-type switches, one set of switches (designated Montgomery 85° C. in the following Tables) was activated by heating to 85° C. (as shown in the patent, column 2, lines 41-44) and breakdown was effected hot. Another set of Montgomery-type switches (designated Montgomery RT in the following Tables) was broken down at room temperature so as to provide a comparison with breakdown as it is normally carried out in the present invention. Switch resistances again were read with a Simpson resistance meter.

(C) Pulse-Off Study

Some of the switches of this invention and some of those of Montgomery which were used in this Pulse-Off Study were first used in a circuit breaker study as follows. The power supply was set at 100 volts and the decade box at 9K ohms, establishing a minimum test current of about 11.1 Ma. The resistance was then reduced in steps of 1K ohms (to increase the test current) between 9K ohms and 1K ohms, and thereafter in steps of 100 ohms, while observing the current increase on the 0-250 Ma milliammeter. The current was recorded as $I_{min}$ at the point just before it dropped sharply to 0 (the switch-off point). This required about 2-4 seconds at the critical current setting. The switch resistance was then checked with the Simpson resistance meter to make sure that the switch was indeed off. The switch was then reactivated (300 volts through a 100K ohm resistance on the decade box) and the $I_{min}$ determination was repeated. The data are recorded in Table VIII.

In order to study switch-off by application of a rapidly decaying current pulse, the circuit described above for initial breakdown was modified to utilize the energy produced by a current discharge from a capacitor. The ground side of the power supply (previously discussed) passed through the decade box and then to one side of the switch. One side of the capacitor (0.05 microfarad ($\mu$F) or, alternatively, a 0.25 microfarad capacitor) goes to ground and the other end is free, first to touch momentarily the high voltage lead (to charge the capacitor), and then to touch momentarily the other side of the switch (to discharge the capacitor). The switch resistance was then read with the Simpson resistance meter to determine if the switch was open or closed.

The switches were tested for switch-off with a 0.05 $\mu$F capacitor at 300 volts, reactivated at 300 volts with a 100K resistor in the line, re-tested for switch-off at 300 volts with a 100 K resistor in the line, reactivated as before, tested for switch-off at 100 volts and again reactivated. The tests were repeated with a 0.25 $\mu$F capacitor except that the 300 volt-100K switch-off was omitted and the order of charging the capacitor at 100 and 300 volts was reversed. The initial resistance in ohms of the low resistance state, the sequences of subjecting the switch to the indicated switch-off and reactivation conditions, and the results in terms of resistance in ohms after each operation are given in Table IX for each switch tested.

TABLE VIII

CIRCUIT BREAKER ACTION OF MONTGOMERY-TYPE SWITCHES AND THE ELECTRIC CURRENT REGULATING JUNCTIONS OF THIS INVENTION

| Switch Type | Initial Turn-On | | | Initial Switch-Off Current | | | Re-Activation | | | Switch-Off Again | | |
|---|---|---|---|---|---|---|---|---|---|---|---|---|
| | Decade Box (ohms) | Volts D.C. | Switch Res. (ohms) | Decade Box (ohms) | $I_{Min}$ Ma | Volts D.C. | Decade Box (ohms) | Volts D.C. | Switch Res. (ohms) | Decade Box (ohms) | $I_{Min}$ Ma | Volts D.C. |
| Montgomery-RT | 1 MEG | 800 | 40 | 900 | 111 | 100 | 100K | 300 | 85 | 1K | 100 | 100 |
| " | " | " | 42 | 900 | 111 | " | " | " | 200 | 2K | 50 | " |
| " | " | " | 38 | 1000 | 100 | " | " | " | 93 | 1K | 100 | " |
| Montgomery-85° C. | 1 MEG | 800 | 22 | 600 | 166 | 100 | 100K | 300 | 52 | 2K | 50 | 100 |
| " | " | " | 20 | 600 | 166 | " | " | " | 72 | 2K | 50 | " |
| " | " | " | 16 | 200 | 500 | " | " | " | 50 | 2K | 50 | " |
| " | " | " | 32 | 600 | 166 | " | " | " | 55 | 2K | 50 | " |
| Polyamide-type | 100K | 300 | 40 | 2K | 50* | 100 | 100K | 300 V | 43 | 2K | 50 | 100 |
| " | " | " | 50 | 2K | 50* | " | " | " | 65 | 2K | 50 | " |
| " | " | " | 15 | 1K | 100* | " | " | " | 20 | 1K | 100 | " |
| " | " | " | 25 | 2K | 50* | " | " | " | 27 | 2K | 50 | " |
| Polyimide-type | 100K | 300 | 20 | 1K | 100* | 100 | 100K | 300 | 18 | 2K | 50 | 100 |
| " | " | " | 22 | 1K | 100* | " | " | " | 65 | 2K | 50 | " |
| " | " | " | 27 | 900 | 100* | " | " | " | 30 | 2K | 50 | " |
| " | 1 MEG | 800 | 22 | 1K | 100* | " | " | " | 20 | 1K | 100 | " |

TABLE VIII-continued
CIRCUIT BREAKER ACTION OF MONTGOMERY-TYPE SWITCHES AND THE ELECTRIC CURRENT REGULATING JUNCTIONS OF THIS INVENTION

| Switch Type | Initial Turn-On | | | Initial Switch-Off Current | | | Re-Activation | | | Switch-Off Again | | |
|---|---|---|---|---|---|---|---|---|---|---|---|---|
| | Decade Box (ohms) | Volts D.C. | Switch Res. (ohms) | Decade Box (ohms) | $I_{Min}$ Ma | Volts D.C. | Decade Box (ohms) | Volts D.C. | Switch Res. (ohms) | Decade Box (ohms) | $I_{Min}$ Ma | Volts D.C. |
| | " | " | 23 | 1K | 100* | " | " | " | 50 | 1K | 100 | " |

*Turns off best by rapidly making and breaking contact whereas Montgomery-type switches turn off best by application of a steady high current.

TABLE IX
PULSE-OFF STUDY OF MONTGOMERY-TYPE SWITCHES AND THE ELECTRIC CURRENT-REGULATING JUNCTION (SWITCHES) OF THE APPLICATION

| Pulse With → Switch Type | Initial Switch Res. (ohms) | 0.05 μF 300 V | Reactivate 300 V/ 100K | 0.05 μF 300 V/ 100K | Reactivate 300 V/ 100K | 0.05 μF 100 V | Reactivate 300K/ 100K | 0.25 μF 100 V | Reactivate 300 V/ 100K | 0.25 μF 300 V | Reactivate 300 V/ 100K |
|---|---|---|---|---|---|---|---|---|---|---|---|
| Montgomery-RT | 85 | No | No | No | No | No | No | No | No | No | No |
| (From Circuit | 200 | Signif. | Change | Change | Change | Change | Change | Change | Change | Change | Change |
| Breaker Study) | 93 | Change | | | | | | | | | |
| Montgomery-RT | 22 | 29 | 29 | 30 | 30 | 32 | 32 | 30 | 30 | 37 | 37 |
| (New switches | 25 | 35 | 35 | 32 | 32 | 30 | 30 | 35 | 35 | 25 | 25 |
| zapped on with | 30 | 10 | 10 | 15 | 15 | 28 | 28 | 20 | 20 | 18 | 18 |
| 800 V/1 MEG) | 50 | 75 | 75 | 60 | 60 | 75 | 75 | 60 | 60 | 35 | 35 |
| Montgomery-85° C. | 52 | No Significant Changes | ← | ← | ← | ← | → | → | → | → | → |
| (From Circuit | 72 | | ← | ← | ← | ← | → | → | → | → | → |
| Breaker Study) | 50 | | ← | ← | ← | ← | → | → | → | → | → |
| | 55 | ← | ← | ← | ← | ← | → | → | → | → | → |
| Polyamide-type | 50 | ∞ | 30 | ∞ | 20 | ∞ | 15 | ∞ | 15 | ∞ | 12 |
| (From Circuit | 60 | ∞ | 10 | ∞ | 12 | ∞ | 10 | ∞ | 10 | ∞ | 10 |
| Breaker Study) | 20 | ∞ | 18 | ∞ | 15 | ∞ | 15 | ∞ | 12 | ∞ | 20 |
| | 28 | ∞ | 55 | ∞ | 100 | ∞ | 50 | ∞ | 55 | ∞ | 50 |
| Polyimide-type | 18 | ∞ | 19 | ∞ | 18 | ∞ | 20 | ∞ | 22 | ∞ | 27 |
| (From Circuit | 65 | ∞ | 70 | ∞ | 63 | ∞ | 70 | ∞ | 73 | ∞ | 70 |
| Breaker Study) | 30 | ∞ | 28 | ∞ | 32 | ∞ | 31 | ∞ | 35 | ∞ | 37 |
| Polyimide-type | 23 | ∞ | 15 | ∞ | 30 | ∞ | 15 | ∞ | 19 | ∞ | 20 |
| (Freshly Zapped 300 V 100K) | 45 | ∞ | 50 | ∞ | 40 | ∞ | 45 | ∞ | 50 | ∞ | 60 |

Table IX shows that the Montgomery switches do not respond to, i.e. are not switched off to the high resistance state by, rapidly decaying current pulses. In marked contrast to Montgomery's switches, the switches of this invention perform smoothly, being alternately switched to a high resistance state (infinite resistance) and reactivated to a low resistance state (in the range 10-100 ohms).

The superior performance of the current-regulating junctions of this invention under pulse-off conditions may be better understood by comparing the currents, times of current flow and the energies involved in the switch-off mode, i.e. the rapid decay current pulse mode of Table IX.

Table X tabulates the conditions, energetics and results of employing rapid decaying current pulses for a representative Montgomery switch and a representative switch of this invention. More specifically, Table X relates to the Montgomery-RT New Switch (whose initial low resistance state had a resistance of 22 (ohms) and summarizes the switch-off conditions, energetics and results in each of the four runs described in Table IX. Table X likewise relates to polyimide-based switches of this invention set forth in Table IX whose initial low resistance was a comparable 23 ohms. The Table X energies were calculated by the equation, $\frac{1}{2}$ $CE^2$, wherein C is the capacitance (farads) and E the voltage (volts). In Run 2, which employed a 100,000 ohm resistor to moderate the capacitor discharge into the switch, the energies were calculated by multiplying $\frac{1}{2} CE^2$ by R(switch) and dividing by R(resistor) plus R(switch).

The current flow times were taken as substantially equivalent to the discharge time constants of the capacitors, calculated by multiplying the capacitance, C, by the resistance, R. In Runs 1, 3 and 4, the resistance is that of the switch itself in the low resistance state; in Run 2, it is the sum of the switch resistance and that of the 100K resistor employed to moderate the discharge.

Table X shows that, in marked contrast to the operable response of the switch of this invention, the Montgomery switch fails to switch-off under the influence of a rapidly decaying current pulse. That failure of the Montgomery switch is all the more significant when it is considered that the current initially used in Runs 1, 3 and 4 overlapped the 20–600 milliampere circuit-breaking current disclosed by Montgomery. Under the capacitor discharge conditions, the current flow times, milliseconds in Run 2 and microseconds in Runs 1, 3 and 4, were just too short to effect switch-off with the sluggishly reacting epoxy-bound switch of Montgomery.

TABLE X

| | CURRENT PULSE SWITCH-OFF CONDITIONS AND RESULTS | | | | | | | |
|---|---|---|---|---|---|---|---|---|
| | POLYIMIDE-BASED SWITCH, FRESHLY ACTIVATED | | | | MONTGOMERY-RT NEW SWITCH | | | |
| | Run 1 0.05 μF 300 V * | Run 2 0.05 μF 300 V 100K** | Run 3 0.25 μF 100 V * | Run 4 0.25 μF 300 V * | Run 1 0.05 μF 300 V * | Run 2 0.05 μF 300 V 100K** | Run 3 0.25 μF 100 V * | Run 4 0.25 μF 300 V * |
| Resistance, Ohms | 23 | 100,000 | 30 | 19 | 22 | 100,000 | 30 | 30 |
| Discharge Time Constant, Milliseconds | 0.001 | 5 | 0.008 | 0.009 | 0.001 | 5 | 0.008 | 0.009 |
| Energy, Joules | 0.0023 | $5.2 \times 10^{-7}$ | 0.0013 | 0.011 | 0.0023 | $5.2 \times 10^{-7}$ | 0.0013 | 0.011 |
| Current ≠ Milliamps | 13,000 | 1 | 3,333 | 15,800 | 14,000 | 1 | 3,333 | 10,000 |
| Switch-Off | Yes | Yes | Yes | Yes | No | No | No | No |

\* Capacity discharge directly through the switch.
\*\*100K resistor in series with the capacitor, which overshadows the switch resistance in the low resistance state.
≠ The applied voltage divided by the initial resistance.

I claim:

1. Electric current regulating junction comprising a normally insulative, electrically activatable composition disposed as a layer 0.1 to 2540 microns in thickness having an electric resistance greater than $10^8$ ohms through its thickness, said composition consisting essentially of 10 to 85 volume percent of a substantially linear, unitary polymeric binder having 15 to 90 volume percent of particles of aluminum substantially homogeneously dispersed in it, said aluminum particles having electrically conductive metallic interiors and thin electrically insulative surface coatings of aluminum oxide sufficient to impart electric resistance between two or more of said particles in contact with one another, the amounts of said binder and particles totaling 100 volume percent, the unitary polymer in said binder having a glass transition temperature of at least 100° C. and being selected from aromatic polyimides, aromatic poly(amide-imides), aromatic poly(ester-imides) and aromatic polyamides, said junction being capable of being (a) activated solely by electrical means from a high to a low electric resistance state in which it will function as an ohmic conductor capable of passing a relatively low reading current, (b) activated solely by electrical means so as to be switched between low electric resistance and relatively high electric resistance states and vice versa, (c) switches from the low resistance to the high resistance state solely by application of relatively low electric currents which are at least 10 times the magnitude of said reading current and which are in the form of current-limited pulses which have a duration not exceeding 100 milliseconds and provide switch-off energy of up to 0.1 joule, said pulse being regulated so that at the end thereof the current pulse will decay rapidly, and (d) used in an alterable read-only memory system.

2. The junction of claim 1 further characterized in that said layer has a thickness of 0.1 to 25.4 microns, the resistance in said high resistance state is at least 10 times the resistance in said low resistance state and said unitary polymer has a glass transition temperature of at least 150° C.

3. The junction of claim 1 or 2 wherein said particles have an average size no greater than 0.1 the junction layer thickness.

4. The junction of claim 2 wherein said current pulse has a duration of up to 10 milliseconds.

5. The junction of claim 2 wherein said current pulse provides up to 0.01 joule.

6. The junction of claim 1 or 2 wherein said polymer is a polyimide.

7. The junction of claim 6 wherein said polyimide contains repeating units represented by the formula:

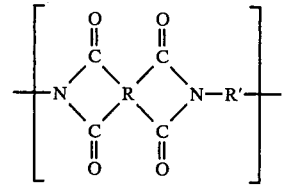

wherein

R is an aromatic moiety having at least one ring of six carbons and characterized by benzenoid unsaturation, and R' is a divalent radical selected from aromatic, aliphatic, cycloaliphatic moieties and combinations of the same.

8. The junction of claim 6 wherein R is a tetravalent radical derived from pyromellitic dianhydride; 2,3,6,7-naphthalenetetracarboxylic dianhydride; 3,3',4,4'-diphenyltetracarboxylic dianhydride; 1,2,5,6-naphthalenetetracarboxylic dianhydride; 2,2',3,3'-diphenyltetracarboxylic dianhydride; 2,2-bis(3,4-dicarboxyphenyl)propane dianhydride; bis(3,4-dicarboxyphenyl)sulfone dianhydride; and 3,3',4,4'-benzophenonetetracarboxylic dianhydride, and R' is a divalent radical derived from m-phenylenediamine; p-phenylenediamine; 2,2-bis(4-aminophenyl)propane; 4,4'-diaminodiphenylmethane; benzidine; 4,4'-diaminodiphenyl sulfide; 4,4'-diaminodiphenyl sulfone; 3,3'-diaminodiphenyl sulfone; and 4,4'-diaminodiphenyl ether.

9. The junction of claim 8 wherein said polyimide is formed by reacting diaminodiphenyl ether and pyromellitic dianhydride.

10. The junction of claim 8 wherein the binder is a poly(amide-imide) formed by reacting m-aminobenzoic acid, p-phenylenediamine and pyromellitic dianhydride.

11. The junction of claim 8 wherein the binder is a polyimide having a $T_g$ of about 380° C. prepared from polyamic acid.

12. The junction of claim 1 or 2 wherein said binder is a polyamide.

13. The junction of claim 12 wherein said polyamide is made up of units represented by the formula

14. The junction of claim 13 wherein the amine units of the polyamide are derived from m-phenylenediamine and wherein the acid units are isophthaloyl or terephthaloyl or mixtures of such phthaloyl units.

15. The junction of claim 1 wherein said particles are aluminum and said binder is a polyamide made up of units represented by the formula

—COC$_6$H$_4$CONHC$_6$H$_4$NH— wherein the amine units are derived from m-phenylenediamine and wherein 70 mole percent of the acid units are isophthaloyl and 30 mole percent thereof are terephthaloyl, and wherein said polyamide has a $T_g$ of 130° C. and is thermally stable at 300° C.

16. The junction of claim 1 wherein said composition consists essentially of 15 to 75 volume percent of said polymeric binder and 25 to 85 volume percent of said particles.

* * * * *